(12) United States Patent
Park et al.

(10) Patent No.: US 10,090,278 B2
(45) Date of Patent: Oct. 2, 2018

(54) SEMICONDUCTOR PACKAGES (71) Applicants: Sang-Sick Park, Seoul (KR); Geol Nam, Hwaseong-si (KR); Tae Hong Min, Hwaseong-si (KR); Jihwan Hwang, Hwaseong-si (KR)

(72) Inventors: Sang-Sick Park, Seoul (KR); Geol Nam, Hwaseong-si (KR); Tae Hong Min, Hwaseong-si (KR); Jihwan Hwang, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 6 days.

(21) Appl. No.: 15/393,754

(22) Filed: Dec. 29, 2016

(65) Prior Publication Data
US 2017/0243856 A1 Aug. 24, 2017

(30) Foreign Application Priority Data

Feb. 18, 2016 (KR) .................. 10-2016-0019302

(51) Int. Cl.
H01L 25/065 (2006.01)
H01L 23/31 (2006.01)
(Continued)

(52) U.S. Cl.
CPC ...... *H01L 25/0657* (2013.01); *H01L 23/3128* (2013.01); *H01L 23/49827* (2013.01); *H01L 24/17* (2013.01); *H01L 24/81* (2013.01); *H01L 25/50* (2013.01); *H01L 2224/05124* (2013.01); *H01L 2224/05147* (2013.01); *H01L 2224/05155* (2013.01); *H01L 2224/1312* (2013.01); *H01L 2224/13109* (2013.01); *H01L 2224/13111* (2013.01); *H01L 2224/13113* (2013.01); *H01L 2224/13117* (2013.01); *H01L 2224/13139* (2013.01); *H01L 2224/13147* (2013.01);
(Continued)

(58) Field of Classification Search
CPC ................. H01L 24/06; H01L 25/0657; H01L 2224/73204; H01L 21/563; H01L 23/3157
See application file for complete search history.

(56) References Cited

U.S. PATENT DOCUMENTS 8,395,259 B2 3/2013 Eun
8,907,498 B2 12/2014 Pagaila et al.
(Continued)

FOREIGN PATENT DOCUMENTS

JP 2003/533872 A 11/2003

*Primary Examiner* — Marcos D Pizarro
*Assistant Examiner* — Antonio Crite
(74) *Attorney, Agent, or Firm* — Harness, Dickey & Pierce, P.L.C.

(57) ABSTRACT

A semiconductor package includes a plurality of semiconductor chips on a substrate. The semiconductor chips include a first semiconductor chip, a second semiconductor chip, and a third semiconductor chip that are sequentially stacked on the substrate. The semiconductor package further includes a plurality of non-conductive layers between the substrate and the first semiconductor chip and between adjacent semiconductor chips among the semiconductor chips. The semiconductor chips include smaller widths as a distance from the substrate increases. Each of the non-conductive layers includes an extension protruding outward from a side surface of an overlying one of the semiconductor chips.

10 Claims, 11 Drawing Sheets (51) Int. Cl.
*H01L 23/498* (2006.01)
*H01L 23/00* (2006.01)
*H01L 25/00* (2006.01)

(52) U.S. Cl.
CPC ............... *H01L 2224/13155* (2013.01); *H01L 2224/16113* (2013.01); *H01L 2224/16146* (2013.01); *H01L 2224/16227* (2013.01); *H01L 2224/16235* (2013.01); *H01L 2224/32225* (2013.01); *H01L 2224/73104* (2013.01); *H01L 2224/9211* (2013.01); *H01L 2225/06513* (2013.01); *H01L 2225/06517* (2013.01); *H01L 2225/06541* (2013.01); *H01L 2225/06548* (2013.01); *H01L 2225/06568* (2013.01); *H01L 2225/06586* (2013.01); *H01L 2924/01058* (2013.01); *H01L 2924/0665* (2013.01); *H01L 2924/1434* (2013.01)

(56) References Cited

U.S. PATENT DOCUMENTS

| | | |
|---|---|---|
| 2011/0272692 A1 | 11/2011 | Han et al. |
| 2013/0147044 A1* | 6/2013 | Eun ................... H01L 21/76898 257/738 |
| 2013/0161795 A1* | 6/2013 | Owada .............. H01L 21/76898 257/620 |
| 2014/0252652 A1 | 9/2014 | Kim |
| 2015/0130083 A1 | 5/2015 | Park et al. |
| 2015/0162265 A1* | 6/2015 | Jo ........................... H01L 24/97 257/774 |
| 2015/0303174 A1 | 10/2015 | Yu et al. |

\* cited by examiner

SEMICONDUCTOR PACKAGES

CROSS-REFERENCE TO RELATED APPLICATIONS

This U.S. non-provisional patent application claims priority under 35 U.S.C. § 119 to Korean Patent Application 10-2016-0019302, filed on Feb. 18, 2016, the entire contents of which are hereby incorporated by reference.

BACKGROUND

The present disclosure relates to a semiconductor package and, more particularly, to a semiconductor package including semiconductor chips including different widths stacked on a substrate.

In the semiconductor industry, packaging technologies have been devised to meet the demand for high capacity, thin and small sizes of semiconductor device and electronic products. One approach is to vertically stack a plurality of semiconductor chips so as to accomplish a chip stack with high density. This packaging technology may have advantages of integrating various kinds semiconductor chips in a smaller area compared to conventional packages with one semiconductor chip.

SUMMARY

Some example embodiments of inventive concepts relate to a semiconductor package including a plurality of semiconductor chips whose widths decrease with increasing distance from a substrate.

Some example embodiments of inventive concepts relate to a semiconductor package in which non-conductive layers are between a substrate and semiconductor chips and between the semiconductor chips while covering side surfaces of the semiconductor chips.

According to an example embodiment of inventive concepts, a semiconductor package may include: a substrate; a plurality of semiconductor chips on the substrate, the semiconductor chips including a first semiconductor chip, a second semiconductor chip, and a third semiconductor chip that are sequentially stacked on the substrate, the semiconductor chips including smaller widths as a distance from the substrate increases; and a plurality of non-conductive layers between the substrate and the first semiconductor chip and between semiconductor chips among the semiconductor chips. Each of the non-conductive layers may include an extension that protrudes outward from a side surface of an overlying one of the semiconductor chips.

According to an example embodiment of inventive concepts, a semiconductor package may include: a substrate including a plurality of vias; a chip stack on the substrate; a lower non-conductive layer; a middle non-conductive layer; and an upper non-conductive layer. The chip stack includes a lower semiconductor chip on the substrate, an upper semiconductor chip on the lower semiconductor chip, and a middle semiconductor chip between the lower semiconductor chip and the upper semiconductor chip. The lower non-conductive layer is between the substrate and the lower semiconductor chip. The middle non-conductive layer is between the lower semiconductor chip and the middle semiconductor chip. The upper non-conductive layer is between the middle semiconductor chip and the upper semiconductor chip. The middle semiconductor chip may include a width that is greater than a width of the upper semiconductor chip and less than a width of the lower semiconductor chip.

According to an example embodiment of inventive concepts, a semiconductor package may include a plurality of non-conductive layers stacked on top of each other, a lower semiconductor chip, a middle semiconductor chip, and an upper semiconductor chip. Each of the non-conductive layers includes extension portions at respective sides that protrude upward compared to a region between the extension portions. The non-conductive layers include a middle non-conductive layer between an upper non-conductive layer and a lower non-conductive layer. A width of the middle non-conductive layer is less than a width of the lower non-conductive layer and greater than a width of the upper non-conductive layer. The lower semiconductor chip is between the lower non-conductive layer and the middle non-conductive layer such that lower semiconductor chip is on the region between the extension portions of the lower non-conductive layer. The middle semiconductor chip is between the middle non-conductive layer and the upper non-conductive layer such that middle semiconductor chip is on the region between the extension portions of the middle non-conductive layer. The upper semiconductor chip is on the region between the extension portions of the upper non-conductive layer.

BRIEF DESCRIPTION OF THE DRAWINGS

The accompanying drawings are included to provide a further understanding of inventive concepts, and are incorporated in and constitute a part of this specification. The drawings illustrate some example embodiments of inventive concepts and, together with the description, serve to explain principles and features of inventive concepts. In the drawings.

DETAILED DESCRIPTION OF EMBODIMENTS

Hereinafter, some example embodiments of inventive concepts will be described in conjunction with the accompanying drawings.

Figure 1:
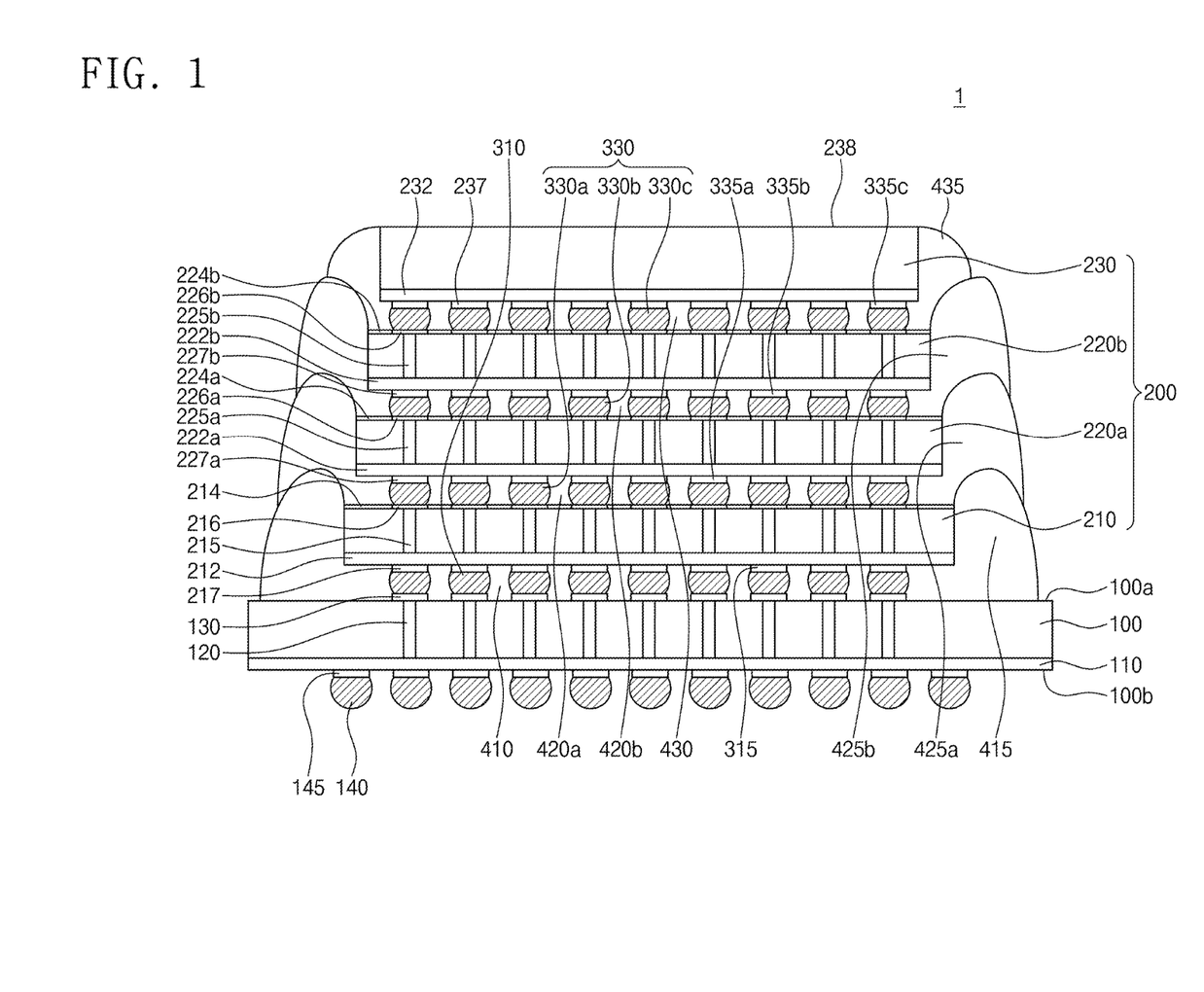
FIG. 1 is a cross-sectional view illustrating a semiconductor package according to an example embodiment of inventive concepts.

FIG. 1 is a cross-sectional view illustrating a semiconductor package according to an example embodiment of inventive concepts.

Referring to FIG. 1, a semiconductor package 1 may include a substrate 100, a chip stack 200, a plurality of connecting members 310 and 330, and a plurality of non-conductive layers 410, 420a, 420b and 430.

The substrate 100 may include a top surface 100a and a bottom surface 100b opposite the top surface 100a. The substrate 100 may be a semiconductor wafer (e.g., silicon wafer) or a printed circuit board (PCB). The semiconductor wafer (e.g., silicon wafer) may have a thickness less than that of the printed circuit board (PCB). The substrate 100 may include a substrate line layer 110 and a first via 120 that connects the substrate line layer 110 to the top surface 100a of the substrate 100. The first via 120 may be provided in plural. The first via 120 may partially penetrate the substrate 100. A substrate pad 130 may be disposed on the top surface 100a of the substrate 100 and may be connected to the first via 120, and an outer terminal 140 may be disposed on the bottom surface 100b of the substrate 100. The outer terminal 140 may be provided on an outer terminal pad 145 disposed on the bottom surface 100b of the substrate 100. For example, at least one of the substrate pad 130 and the outer terminal pad 145 may include various metallic materials such as copper (Cu), aluminum (Al), nickel (Ni), combinations thereof, and/or the like. The outer terminal 140 may include at least one of tin (Sn), silver (Ag), copper (Cu), nickel (Ni), bismuth (Bi), indium (In), antimony (Sb), cerium (Ce), and combinations thereof.

The chip stack 200 may be disposed on the substrate 100. The chip stack 200 may include a plurality of semiconductor chips 210, 220a, 220b and 230. In an example embodiment, the plurality of semiconductor chips 210, 220a, 220b and 230 may be of the same type. For example, the plurality of semiconductor chips 210, 220a, 220b and 230 may be memory chips. The chip stack 200 may include a lower semiconductor chip 210 which is directly connected to the substrate 100, middle semiconductor chips 220a and 220b disposed on the lower semiconductor chip 210, and an upper semiconductor chip 230 disposed on the middle semiconductor chips 220a and 220b. The lower semiconductor chip 210, the middle semiconductor chips 220a and 220b, and the upper semiconductor chip 230 may be sequentially stacked on the substrate 100. The middle semiconductor chips 220a and 220b may include a first middle semiconductor chip 220a on the lower semiconductor chip 210 and a second middle semiconductor chip 220b on the first middle semiconductor chip 220a. In an example embodiment, two middle semiconductor chips 220a and 220b may be disposed between the lower and upper semiconductor chips 210 and 230, but example embodiments are not limited thereto. In some example embodiments, one or more middle semiconductor chips 220a and 220b may be interposed between the lower and upper semiconductor chips 210 and 230. As a distance becomes further away from the substrate 100, the semiconductor chips 210, 220a, 220b and 230 may have smaller sizes (e.g., widths or areas). This will be described in more detail below.

The lower semiconductor chip 210 may include a bottom surface facing the substrate 100 and a top surface opposite the bottom surface. The lower semiconductor chip 210 may include a first line layer 212 facing the substrate 100 and a first protection layer 214 opposite the first line layer 212. For example, the first protection layer 214 may be an insulative coating layer including an epoxy resin. The lower semiconductor chip 210 may include a second via 215 that partially penetrates therethrough in a direction toward the first line layer 212 from the first protection layer 214. The second via 215 may be provided in plural. The second via 215 may be surrounded by an insulation layer (not shown). For example, the insulation layer may include at least one of silicon oxide, silicon nitride, silicon oxynitride, and low-k dielectric material. The second via 215 may be connected to the first line layer 212. A first top pad 216 may be disposed in the first protection layer 214, and a first bottom pad 217 may be disposed on the first line layer 212. The first top pad 216 may be connected to the second via 215. The first top pad 216 may have a top surface which is not covered by the first protection layer 214. The first top pad 216 and the first bottom pad 217 may be electrically connected to each other through the first line layer 212 and the second via 215. For example, at least one of the first top pad 216 and the first bottom pad 217 may include various metallic materials such as copper (Cu), aluminum (Al), nickel (Ni), combinations thereof and/or the like.

The first middle semiconductor chip 220a may have a bottom surface facing the lower semiconductor chip 210 and a top surface opposite the bottom surface. The first middle semiconductor chip 220a may include a second line layer 222a facing the lower semiconductor chip 210 and a second protection layer 224a opposite the second line layer 222a. For example, the second protection layer 224a may be an insulative coating layer including an epoxy resin. The first middle semiconductor chip 220a may include a third via 225a that partially penetrates therethrough in a direction toward the second line layer 222a from the second protection layer 224a. The third via 225a may be provided in plural. The third via 225a may be surrounded by an insulation layer (not shown). The insulation layer may include at least one of silicon oxide, silicon nitride, silicon oxynitride, and low-k dielectric material. The third via 225a may be connected to the second line layer 222a. A second top pad 226a may be disposed in the second protection layer 224a, and a second bottom pad 227a may be disposed on the second line layer 222a. The second top pad 226a may be connected to the third via 225a. The second top pad 226a may have a top surface which is not covered by the second protection layer 224a. The second top pad 226a and the second bottom pad 227a may be electrically connected to each other through the second line layer 222a and the third via 225a. For example, at least one of the second top pad 226a and the second bottom pad 227a may include various metallic materials such as copper (Cu), aluminum (Al), nickel (Ni), combinations thereof and/or the like.

The second middle semiconductor chip 220b may have a bottom surface facing the first middle semiconductor chip 220a and a top surface opposite the bottom surface. The second middle semiconductor chip 220b may include a third line layer 222b facing the first middle semiconductor chip 220a and a third protection layer 224b opposite the third line layer 222b. For example, the third protection layer 224a may be an insulative coating layer including an epoxy resin. The second middle semiconductor chip 220b may include a fourth via 225b that partially penetrates therethrough in a direction toward the third line layer 222b from the third protection layer 224b. The fourth via 225b may be provided in plural. The fourth via 225b may be surrounded by an insulation layer (not shown). The insulation layer may include at least one of silicon oxide, silicon nitride, silicon oxynitride, and low-k dielectric material. The fourth via 225b may be connected to the third line layer 222b. A third top pad 226b may be disposed in the third protection layer 224b, and a third bottom pad 227b may be disposed on the third line layer 222b. The third top pad 226b may be connected to the fourth via 225b. The third top pad 226b may have a top surface which is not covered by the third protection layer 224b. The third top pad 226b and the third bottom pad 227b may be electrically connected to each other through the third line layer 222b and the fourth via 225b. For example, at least one of the third top pad 226b and the third bottom pad 227b may include various metallic materials such as copper (Cu), aluminum (Al), nickel (Ni), combinations thereof and/or the like.

The upper semiconductor chip 230 may have a bottom surface facing the second middle semiconductor chip 220b and a top surface opposite the bottom surface. The upper semiconductor chip 230 may include a fourth line layer 232 facing the second middle semiconductor chip 220b. A fourth bottom pad 237 may be disposed on the fourth line layer 232. The upper semiconductor chip 230 may have a thickness greater than that of each of the lower semiconductor chip 210 and the middle semiconductor chips 220a and 220b. The fourth bottom pad 237 may include various metallic materials such as copper (Cu), aluminum (Al), nickel (Ni), combinations thereof, and/or the like.

The connecting members 310 and 330 may connect adjacent ones of the substrate 100 and the semiconductor chips 210, 220a, 220b and 230. The connecting members 310 and 330 may include a lower connecting member 310 that connects the substrate 100 and the lower semiconductor chip 210 to each other and an upper connecting member 330 that connects adjacent ones of the semiconductor chips 210, 220a, 220b and 230 to each other. At least one of the lower and upper connecting members 310 and 330 may be a solder ball including at least one of tin (Sn), silver (Ag), copper (Cu), nickel (Ni), bismuth (Bi), indium (In), antimony (Sb), cerium (Ce), and combinations thereof.

The lower connecting member 310 may be interposed between the substrate pad 130 of the substrate 100 and the first bottom pad 217 of the lower semiconductor chip 210. The lower connecting member 310 may have a thickness that is substantially the same as a distance between the substrate pad 130 and the first bottom pad 217. The lower connecting member 310 may electrically connect the lower semiconductor chip 210 to the substrate 100. The lower connecting member 310 may be provided in plural.

The upper connecting member 330 may include a first upper connecting member 330a that connects the lower semiconductor chip 210 to the first middle semiconductor chip 220a, a second upper connecting member 330b that connects the first middle semiconductor chip 220a to the second middle semiconductor chip 220b, and a third upper connecting member 330c that connects the second middle semiconductor chip 220b to the upper semiconductor chip 230. The first upper connecting member 330a may be interposed between the first top pad 216 of the lower semiconductor chip 210 and the second bottom pad 227a of the first middle semiconductor chip 220a. The second upper connecting member 330b may be interposed between the second top pad 226a of the first middle semiconductor chip 220a and the third bottom pad 227b of the second middle semiconductor chip 220b. The third upper connecting member 330c may be interposed between the third top pad 226b of the second middle semiconductor chip 220b and the fourth bottom pad 237 of the upper semiconductor chip 230. The first upper connecting member 330a may have a thickness substantially the same as a distance between the first top pad 216 and the second bottom pad 227a. The second upper connecting member 330b may have a thickness substantially the same as a distance between the second top pad 226a and the third bottom pad 227b. The third upper connecting member 330c may have a thickness substantially the same as a distance between the third top pad 226b and the fourth bottom pad 237. The first to third upper connecting members 330a, 330b and 330c may electrically connect the semiconductor chips 210, 220a, 220b and 230 with one another. Each of the first to third upper connecting members 330a, 330b and 330c may be provided in plural.

The non-conductive layers 410, 420a, 420b and 430 may be disposed between the substrate 10 and the chip stack 200 and between adjacent ones of the semiconductor chips 210, 220a, 220b and 230, and may surround the connecting members 310 and 330. The non-conductive layers 410, 420a, 420b and 430 may include a lower non-conductive layer 410 disposed on the substrate 100, middle non-conductive layers 420a and 420b disposed on the lower non-conductive layer 410, and an upper non-conductive layer 430 disposed on the middle non-conductive layers 420a and 420b. The lower, middle, and upper non-conductive layers 410, 420a, 420b and 430 may respectively include an epoxy-based material having no conductive particles therein.

The lower non-conductive layer 410 may be disposed between the substrate 100 and the lower semiconductor chip 210 and may surround the lower connecting member 310. The lower non-conductive layer 410 may have a lower extension 415 protruding outward from side surfaces of the lower semiconductor chip 210 and further protruding in a vertical direction from the top surface 100a of the substrate 100. The lower extension 415 may have an uppermost end higher than the top surface of the lower semiconductor chip 210. The lower extension 415 may be supported by the substrate 100. The lower non-conductive layer 410 may have no conductive particles therein such that adjacent lower connecting members 310 may be free from electrical short therebetween, which may achieve a fine pitch between the lower connecting members 310. Furthermore, the lower non-conductive layer 410 may serve as an under-fill layer between the substrate 100 and the lower semiconductor chip 210 such that the lower connecting member 310 may have an enhanced mechanical durability.

The middle non-conductive layers 420a and 420b may include a first middle non-conductive layer 420a and a second middle non-conductive layer 420b. The first middle non-conductive layer 420a may be disposed between the lower semiconductor chip 210 and the first middle semiconductor chip 220a and may surround the first upper connecting member 330a. The first middle non-conductive layer 420a may have a first middle extension 425a protruding outward from side surfaces of the first middle semiconductor chip 220a and further protruding in the vertical direction from the top surface 100a of the substrate 100. The first middle extension 425a may have an uppermost end higher than the top surface of the first middle semiconductor chip 220a. The first middle extension 425a may be supported by the lower extension 415. The second middle non-conductive layer 420b may be disposed between the first middle semiconductor chip 220a and the second middle semiconductor chip 220b and may surround the second upper connecting member 330b. The second middle non-conductive layer 420b may have a second middle extension 425b protruding outward from side surfaces of the second middle semiconductor chip 220b and further protruding in the vertical direction from the top surface 100a of the substrate 100. The second middle extension 425b may have an uppermost end higher than the top surface of the second middle semiconductor chip 220b. The second middle extension 425b may be supported by the first middle extension 425a. The middle non-conductive layers 420a and 420b may have no conductive particles therein such that adjacent ones of the first and second upper connecting members 330a and 330b may be free from electrical short respectively therebetween, which may achieve fine pitches between the first upper connecting members 330a and between the second upper connecting members 330b. Furthermore, the middle non-conductive layers 420a and 420b may respectively serve as under-fill layers between the lower semiconductor chip 210 and the first middle semiconductor chip 220a and between the first middle semiconductor chip 220a and the second middle semiconductor chip 220b such that the first and second upper connecting members 330a and 330b may respectively have an enhanced mechanical durability.

The upper non-conductive layer 430 may be disposed between the second middle semiconductor chip 220b and the upper semiconductor chip 230 and may surround the third upper connecting member 330c. The upper non-conductive layer 430 may have an upper extension 435 protruding outward from side surfaces of the upper semiconductor chip 230 and further protruding in the vertical direction from the top surface 100a of the substrate 100. The upper extension 435 may have an uppermost end flush with or lower than a top surface 238 of the upper semiconductor chip 230. The upper extension 435 may be supported by the second middle extension 425b. The upper non-conductive layer 430 may have no conductive particles therein such that adjacent third upper connecting members 330c may be free from electrical short therebetween, which may achieve a fine pitch between the third upper connecting members 330c. Furthermore, the upper non-conductive layer 430 may serve as an under-fill layer between the second middle semiconductor chip 220b and the upper semiconductor chip 230 such that the third upper connecting member 330c may have an enhanced mechanical durability.

The first middle non-conductive layer 420a may have a width that is less than that of the lower non-conductive layer 410, the second middle non-conductive layer 420b may have a width less than that of the first middle non-conductive layer 420a, and the upper non-conductive layer 430 may have a width less than that of the second middle non-conductive layer 420b. Hereinafter, the width may correspond to a length extending along a direction substantially parallel to the top surface 100a of the substrate 100.

In an example embodiment, the chip stack 420 may be supported by the lower extension 415, the first middle extension 425a, the second middle extension 425b, and the upper extension 435. In other words, the lower extension 415, the first middle extension 425a, the second middle extension 425b, and the upper extension 435 may surround the side surfaces of the semiconductor chips 210, 220a, 220b and 230. Accordingly, the semiconductor package 1 may have a structural feature to protect the chip stack 200 from external impacts and pollution without a mold layer and/or an under-fill layer.

In an example embodiment, the lower connecting member 310 and the upper connecting member 330 may have the same thickness. In general, a pitch between solder lands in a printed circuit board (PCB) may be greater than that of solder lands in a silicon wafer. The thickness of solder ball may decrease in keeping with the pitch between the solder lands. For example, in case that the substrate 100 is a silicon wafer, the lower connecting member 310 may have a relatively small thickness compared with the case that the substrate 100 is a printed circuit board (PCB). Since a fine pitch between the lower connecting members 310 is achieved, the lower and upper connecting members 310 and 330 may have the same thickness and the semiconductor package 1 may have a decreased thickness.

Figure 2:
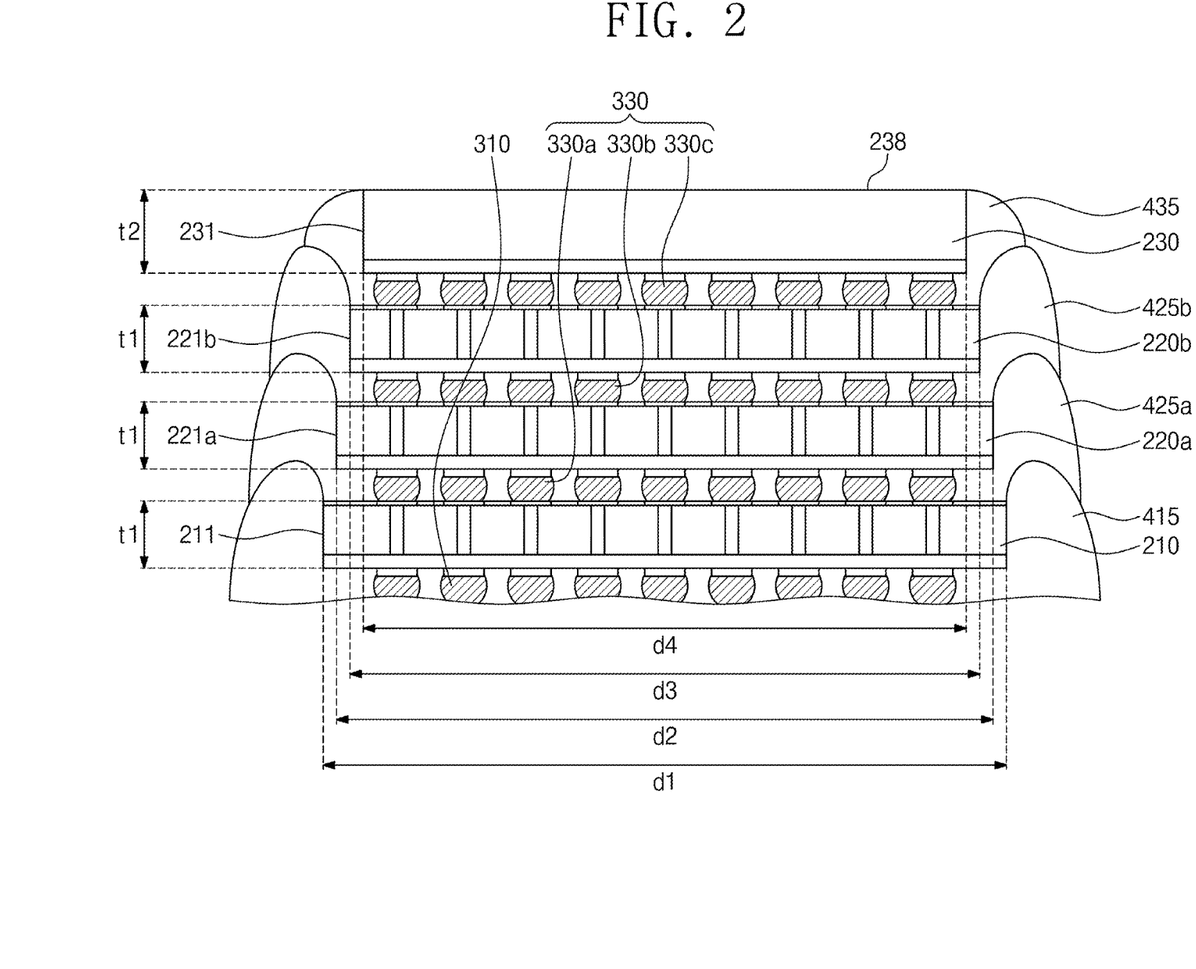
FIG. 2 is a cross-sectional view illustrating semiconductor chips according to an example embodiment of inventive concepts.
Figure 3A:
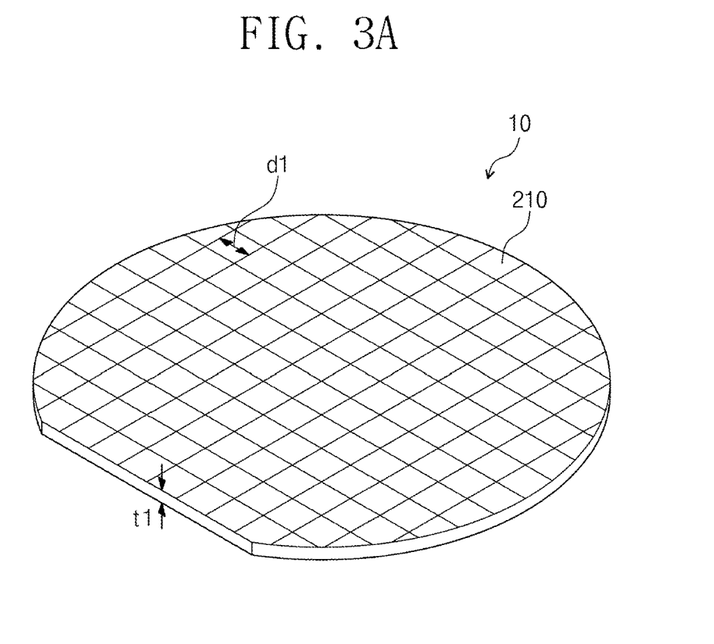
FIGS. 3A through 3D are perspective views illustrating wafers including semiconductor chips according to an example embodiment of inventive concepts.
Figure 3B:
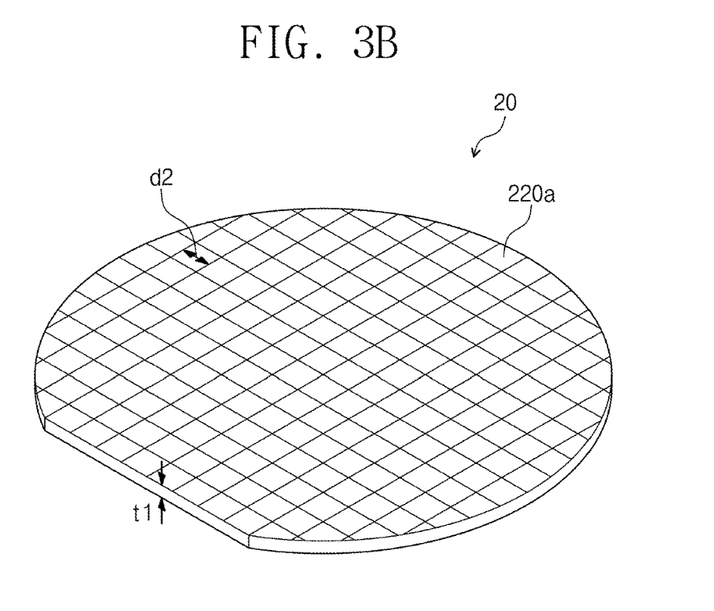
Figure 3C:
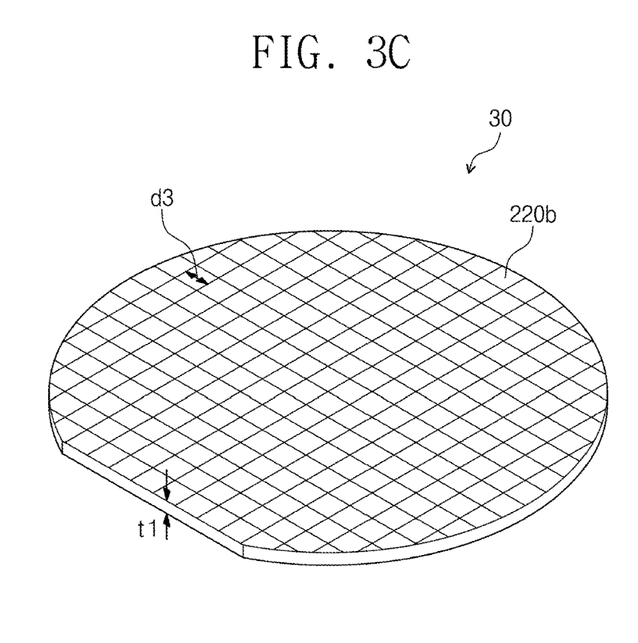
Figure 3D:
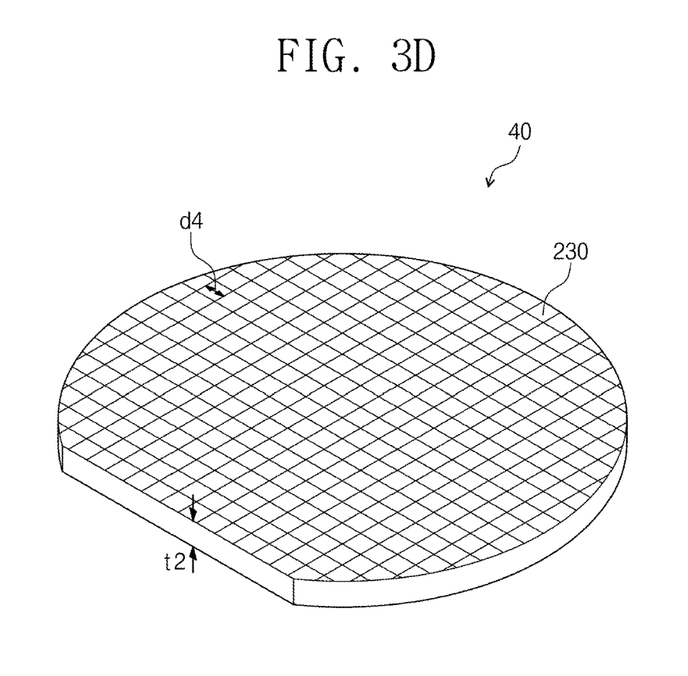

FIG. 2 is a cross-sectional view illustrating semiconductor chips according to an example embodiment of inventive concepts. In the description that follows, a discussion of features identical those of FIG. 1 may be omitted for the sake of brevity.

Referring to FIG. 2, there may be provided the lower semiconductor chip 210, the first and second middle semiconductor chips 220a and 220b, and the upper semiconductor chip 230 that have different widths from one another. The lower semiconductor chip 210 may have side surfaces 211 in contact with the lower extension 415, the first middle semiconductor chip 220a may have side surfaces 221a in contact with the first middle extension 425a, the second middle semiconductor chip 220b may have side surfaces 221b in contact with the second middle extension 425b, and the upper semiconductor chip 230 may have side surfaces 231 in contact with the upper extension 435.

For example, the lower semiconductor chip 210 may have a first width d1. The first middle semiconductor chip 220a may have a second width d2. The second middle semiconductor chip 220b may have a third width d3. The upper semiconductor chip 230 may have a fourth width d4. The second width d2 may be less than the first width d1. The he third width d3 may be less than the second width d2. The fourth width d4 may be less than the third width d3. For example, the lower semiconductor chip 210 and the first and second middle semiconductor chips 220a and 220b each may have a first thickness t1, and the upper semiconductor chip 230 may have a second thickness t2. The second thickness t2 may be greater than the first thickness t1.

The lower extension 415 may protrude in the vertical direction from the top surface 100a of the substrate 100 to cover the side surfaces 211 of the lower semiconductor chip 210. The lower extension 415 may be spaced apart from the side surfaces 211a of the first middle semiconductor chip 220a. The uppermost end of the lower extension 415 may be higher than the top surface of the lower semiconductor chip 210 and a bottom surface of the first middle semiconductor chip 220a. The first middle extension 425a may protrude in the vertical direction from the top surface 100a of the substrate 100 to cover the side surfaces 221a of the first middle semiconductor chip 220a. The first middle extension 425a may be spaced apart from the side surfaces 221b of the second middle semiconductor chip 220b. The first middle extension 425a may be disposed on the lower extension 415. The uppermost end of the first middle extension 425a may be higher than the top surface of the first middle semiconductor chip 220a and a bottom surface of the second middle semiconductor chip 220b. The second middle extension 425b may protrude in the vertical direction from the top surface 100a of the substrate 100 to cover the side surfaces 221b of the second middle semiconductor chip 220b. The second middle extension 425b may be spaced apart from the side surfaces 231 of the upper semiconductor chip 230. The second middle extension 425b may be disposed on the first middle extension 425a. The uppermost end of the second middle extension 425b may be higher than the top surface of the second middle semiconductor chip 220b and a bottom surface of the upper semiconductor chip 230. The upper extension 435 may protrude in the vertical direction from the top surface 100a of the substrate 100 to cover the side surfaces 231 of the upper semiconductor chip 230. The upper extension 435 may be disposed on the second middle extension 425b. The uppermost end of the upper extension 435 may be flush with or lower than the top surface 238 of the upper semiconductor chip 230. The lower extension 415 may not be in contact with the first middle semiconductor chip 220a, the first middle extension 425a may not be in contact with the second middle semiconductor chip 220b, and the second middle extension 425b may not be in contact with the upper semiconductor chip 230.

In an example embodiment, since intervals are present between the lower extension 415 and the first middle semiconductor chip 220a, between the first middle extension 425a and the second middle semiconductor chip 220b, and between the second middle extension 425b and the upper semiconductor chip 230, it may be possible to reduce and/or prevent cracks from being generated when the extensions 415, 425a and 425b are in contact with edges of the first and second middle semiconductor chips 220a and 220b and the upper semiconductor chip 230. Because the semiconductor chips 210, 220a, 220b and 230 may have the smaller widths with increasing from the substrate 10 of FIG. 1, and thus it may be possible to reduce and/or prevent cracks from being produced at edges of the semiconductor chips 210, 220a, 220b and 230. Furthermore, the intervals between the extensions 415, 425a and 425b and the semiconductor chips 220a, 220b and 230 may induce the reduction of gaps between the semiconductor chips 210, 220a, 220b and 230 while not contacting the semiconductor chips 210, 220a, 220b and 230 with the extensions 415, 425a and 425b, and thus it may be possible to reduce and/or prevent poor interconnections between the connecting member 310 and the semiconductor chips 210, 220a, 220b and 230. In other words, it may be advantageous to reduce and/or prevent electrical opens between the semiconductor chips 210, 220a, 220b and 230, which may enhance bonding reliability.

In an example embodiment, since the upper semiconductor chip 230 has the second thickness t2 greater than the first thicknesses t1 of the lower, first middle, and second middle semiconductor chips 210, 220a and 220b, the upper extension 435 may have the uppermost end flush with or lower than the top surface 238 of the upper semiconductor chip 230. Accordingly, the upper extension 435 may not suffer from defects that are caused by external impact.

In an example embodiment, the lower connecting member 310 and the upper connecting member 330 may have the same thickness. Accordingly, it may be possible to easily bond the semiconductor chips 210, 220a, 220b and 230 and achieve simplicity of process.

Alternatively, the upper semiconductor chip 230 may have a thickness substantially the same as those of the lower semiconductor chip 210 and the first and second middle semiconductor chips 220a and 220b, or the lower semiconductor chip 210 and the middle semiconductor chips 220a and 220b may have different thicknesses from one another. In this case, it may be possible to adjust process conditions (e.g., pressure at thermo-compression bonding process, a volume of non-conductive material provided to the semiconductor chips 210, 220a, 220b and 230, etc.) to allow the upper extension 435 to have the uppermost end flush with or lower than the top surface 238 of the upper semiconductor chip 230.

FIGS. 3A through 3D are perspective views illustrating wafers including semiconductor chips according to an example embodiment of inventive concepts.

Referring to FIGS. 3A through 3D, a first wafer 10 may include a plurality of the lower semiconductor chips 210. Each of the lower semiconductor chips 210 may have the first thickness t1 substantially the same as that of the first wafer 10. A cutting process (e.g., sawing process) may be performed to divide the first wafer 10 into the plurality of the lower semiconductor chips 210 each having the first width d1.

A second wafer 20 may include a plurality of the first middle semiconductor chips 220a. Each of the first middle semiconductor chips 220a may have the first thickness t1 substantially the same as that of the second wafer 20. A cutting process (e.g., sawing process) may be performed to divide the second wafer 20 into the plurality of the first middle semiconductor chips 220a each having the second width d2.

A third wafer 30 may include a plurality of the second middle semiconductor chips 220b. Each of the second middle semiconductor chips 220b may have the first thickness t1 substantially the same as that of the third wafer 30. A cutting process (e.g., sawing process) may be performed to divide the third wafer 30 into the plurality of the second middle semiconductor chips 220b each having the third width d3.

A fourth wafer 40 may include a plurality of the upper semiconductor chips 230. Each of the upper semiconductor chips 230 may have the second thickness t2 substantially the same as that of the fourth wafer 40. A cutting process (e.g., sawing process) may be performed to divide the fourth wafer 40 into the plurality of the upper semiconductor chips 230 each having the fourth width d4.

The semiconductor package 1 of FIG. 1 may be fabricated to include the semiconductor chips 210, 220a, 220b and 230 that are separated from corresponding one of the wafers 10, 20, 30 and 40.

FIGS. 4A through 4F are cross-sectional views illustrating a method for fabricating a semiconductor package according to an example embodiment of inventive concepts. In the description that follows, repeated descriptions thereof may be omitted for the sake of brevity.

Figure 4A:
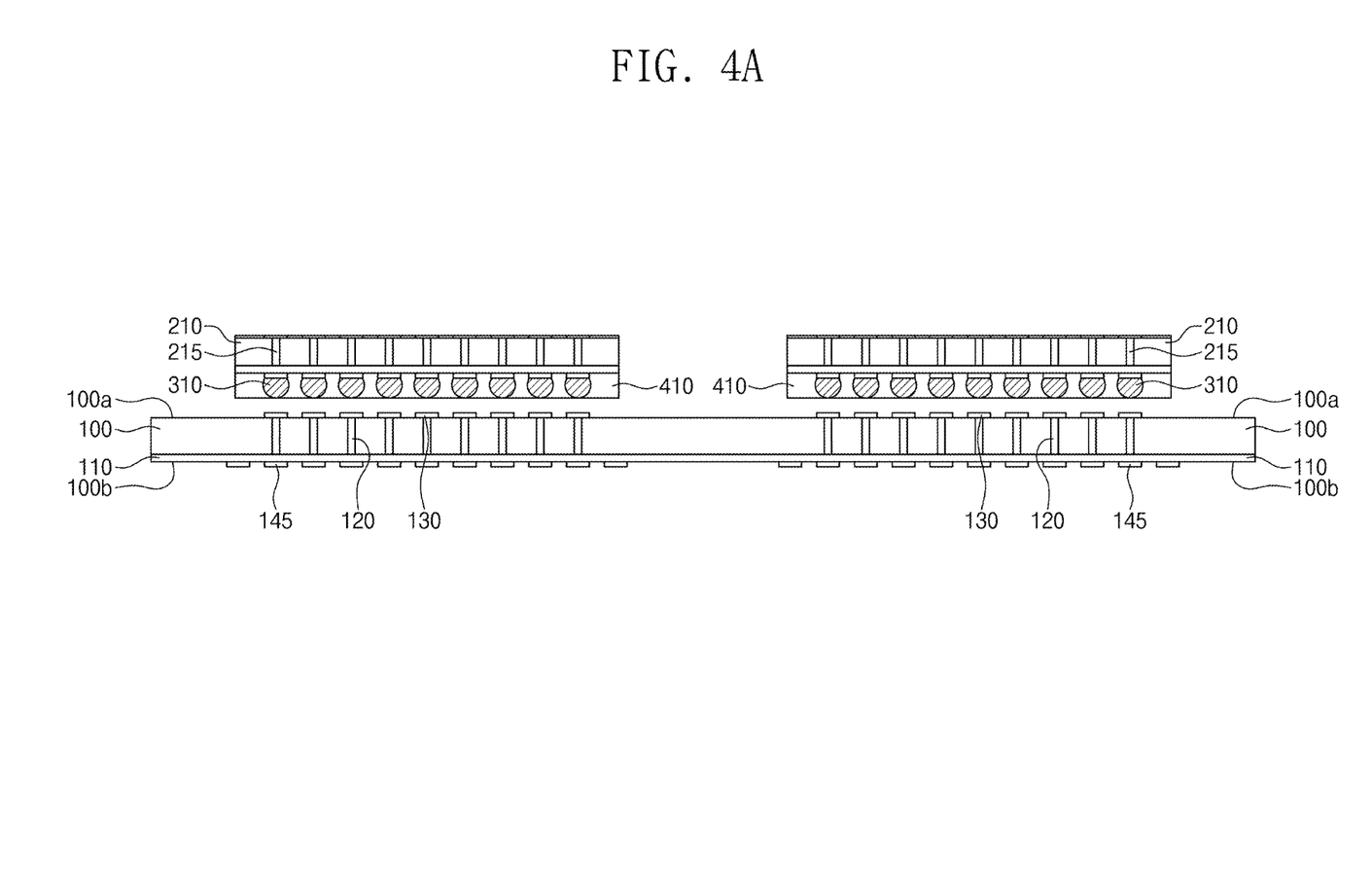
FIGS. 4A through 4F are cross-sectional views illustrating a method for fabricating a semiconductor package according to an example embodiment of inventive concepts.

Referring to FIG. 4A, a plurality of lower semiconductor chips 210 may be provided on a substrate 10. The substrate 10 may have a top surface 100a and a bottom surface 100b opposite thereto. For example, the substrate 100 may be a semiconductor wafer (e.g., silicon wafer) or a printed circuit board (PCB). The substrate 100 may include a plurality of first vias 120 each partially penetrating the substrate 100. The substrate 100 may have a plurality of substrate pads 130 disposed on the top surface 100a and a plurality of outer terminal pads 145 disposed on the bottom surface 100b. Each of the lower semiconductor chips 210 may include a plurality of second vias 215. A plurality of lower connecting members 310 and a lower non-conductive layer 410 surrounding the lower connecting members 310 may be provided on a bottom surface of each of the lower semiconductor chips 210. For example, the lower non-conductive layer 410 may be a non-conductive adhesive or film. In case that the lower non-conductive layer 410 is the non-conductive adhesive, a liquid non-conductive adhesive may be dispensed to coat the lower semiconductor chip 210. In case that the lower non-conductive layer 410 is the non-conductive film, the non-conductive film may be adhered to the lower semiconductor chip 210.

Figure 4B:
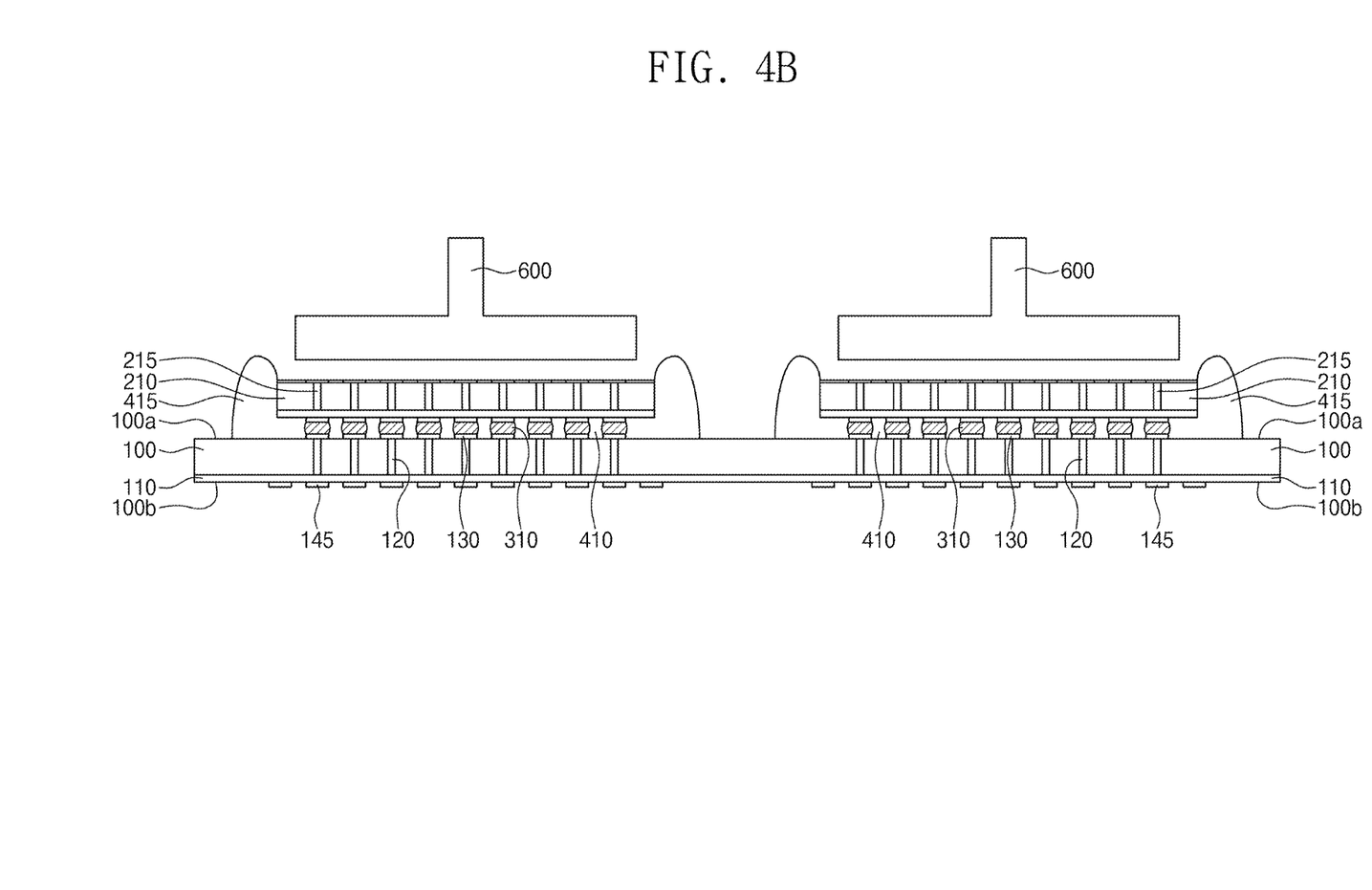

Referring to FIGS. 4B, a thermo-compression bonding process may be performed to couple the lower semiconductor chips 210 onto the substrate 100. The lower connecting members 310 may electrically connect the lower semiconductor chips 210 to the substrate 100. For example, the bonding process may employ a bonding tool 600 whose width is less than that of the lower semiconductor chip 210. When the lower semiconductor chips 210 are compressed in a direction toward the substrate 100, the lower non-conductive layers 410 may protrude outward from side surfaces of the lower semiconductor chips 210 and further protrude in a vertical direction from the top surface 100a of the substrate 100. Protruding portions of the lower non-conductive layers 410 may be formed or referred to as lower extensions 415.

Figure 4C:
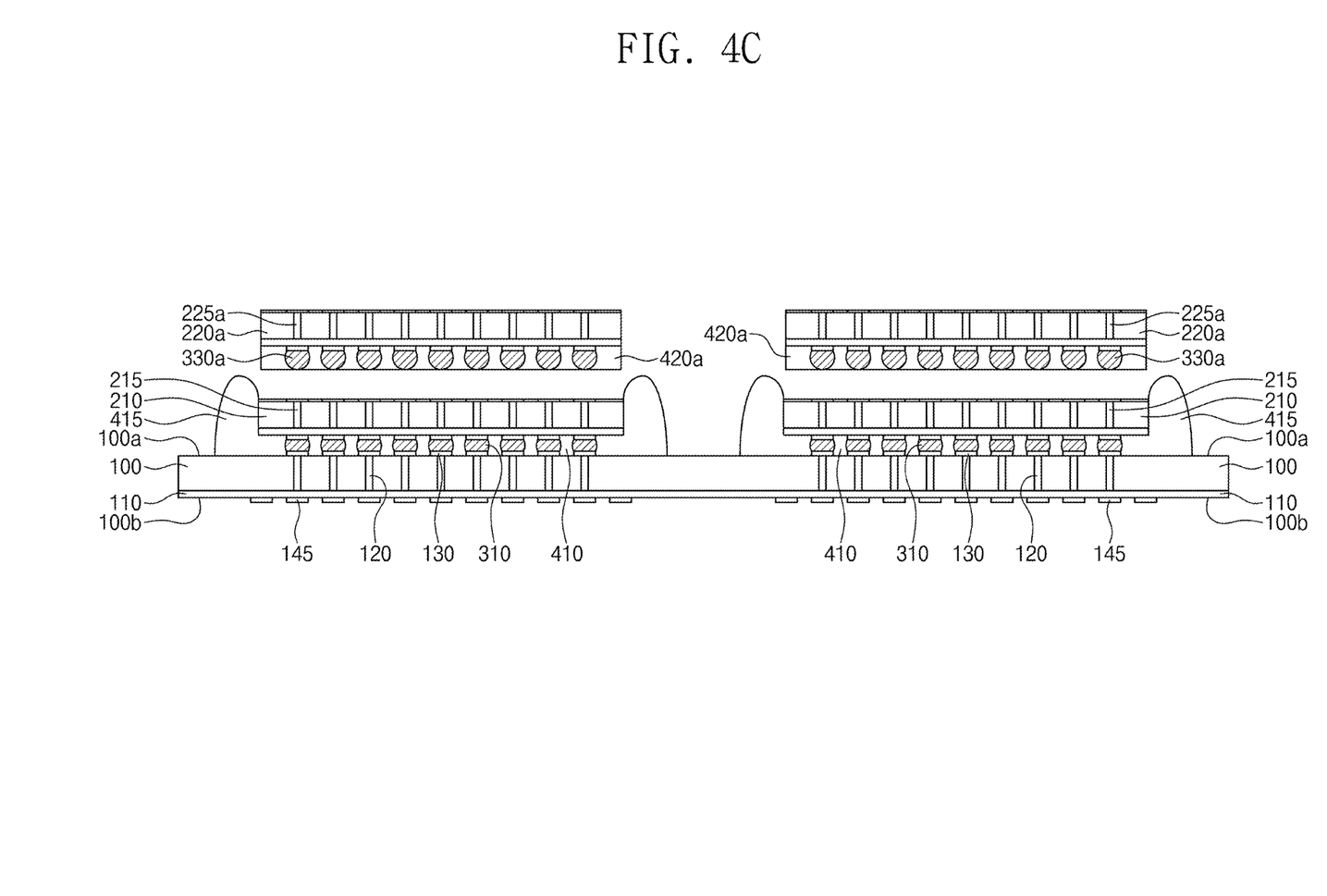

Referring to FIG. 4C, a plurality of first middle semiconductor chips 220a may be provided on the lower semiconductor chips 210. Each of the first middles semiconductor chips 220a may include a plurality of third vias 225a. A plurality of upper connecting members 330a and a first middle non-conductive layer 420 surrounding the upper connecting members 330a may be provided on a bottom surface of each of the first middle semiconductor chips 220a.

Figure 4D:
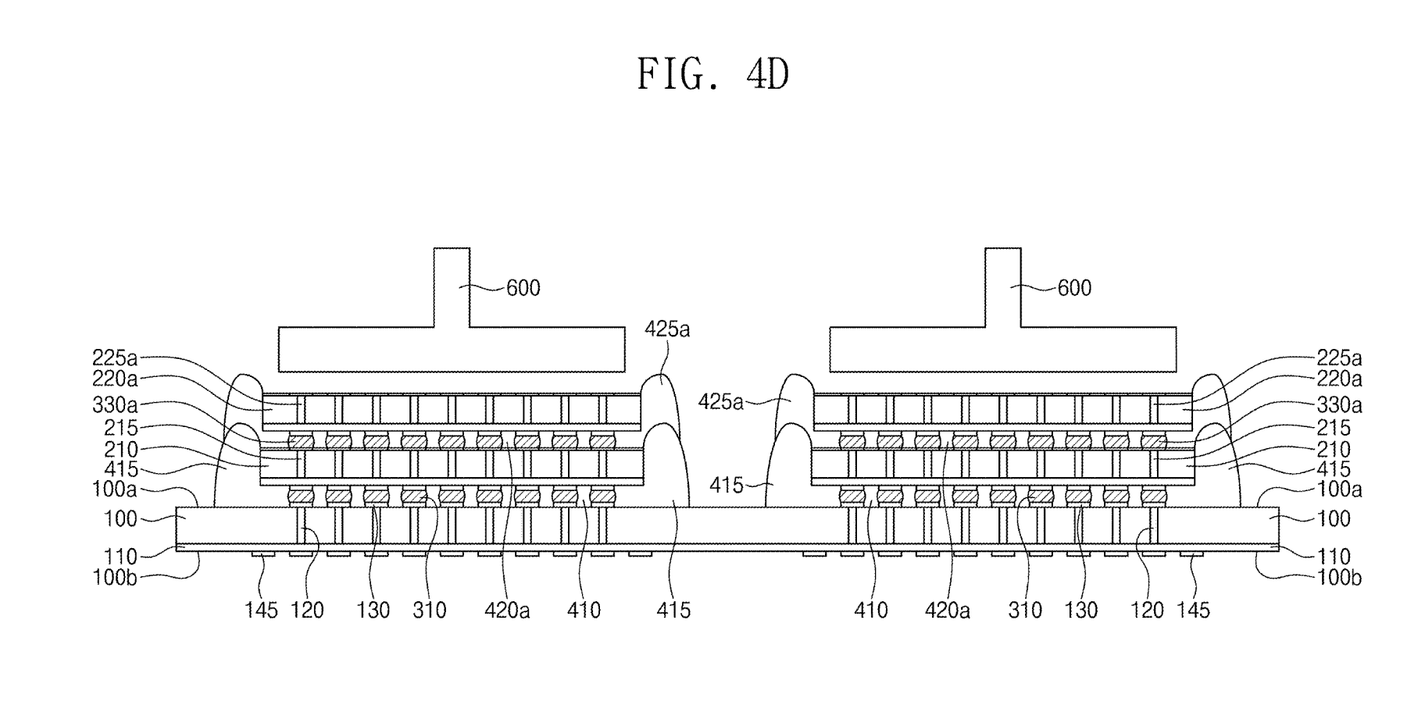

Referring to FIGS. 4D, a thermo-compression bonding process may be performed to couple the first middle semiconductor chips 220a onto the lower semiconductor chips 210. Each of the first middle semiconductor chips 220a may have a width less than that of each of the lower semiconductor chips 210. Accordingly, even though the first middle semiconductor chips 220a are coupled to the lower semiconductor chips 210, the first middle semiconductor chips 220a may not be in contact with the lower extensions 415. The first upper connecting members 330a may electrically connect the first middle semiconductor chips 220a to the lower semiconductor chips 210. For example, the bonding process may employ a bonding tool 600 whose width is less than that of the first middle semiconductor chip 220a. When the thermo-compression bonding process may allow the first middle non-conductive layers 420a to protrude outward from side surfaces of the first middle semiconductor chips 220a and further protrude in the vertical direction from the top surface 100a of the substrate 100. Protruding portions of the first non-conductive layers 420a may be formed or referred to as first middle extensions 425a.

Figure 4E:
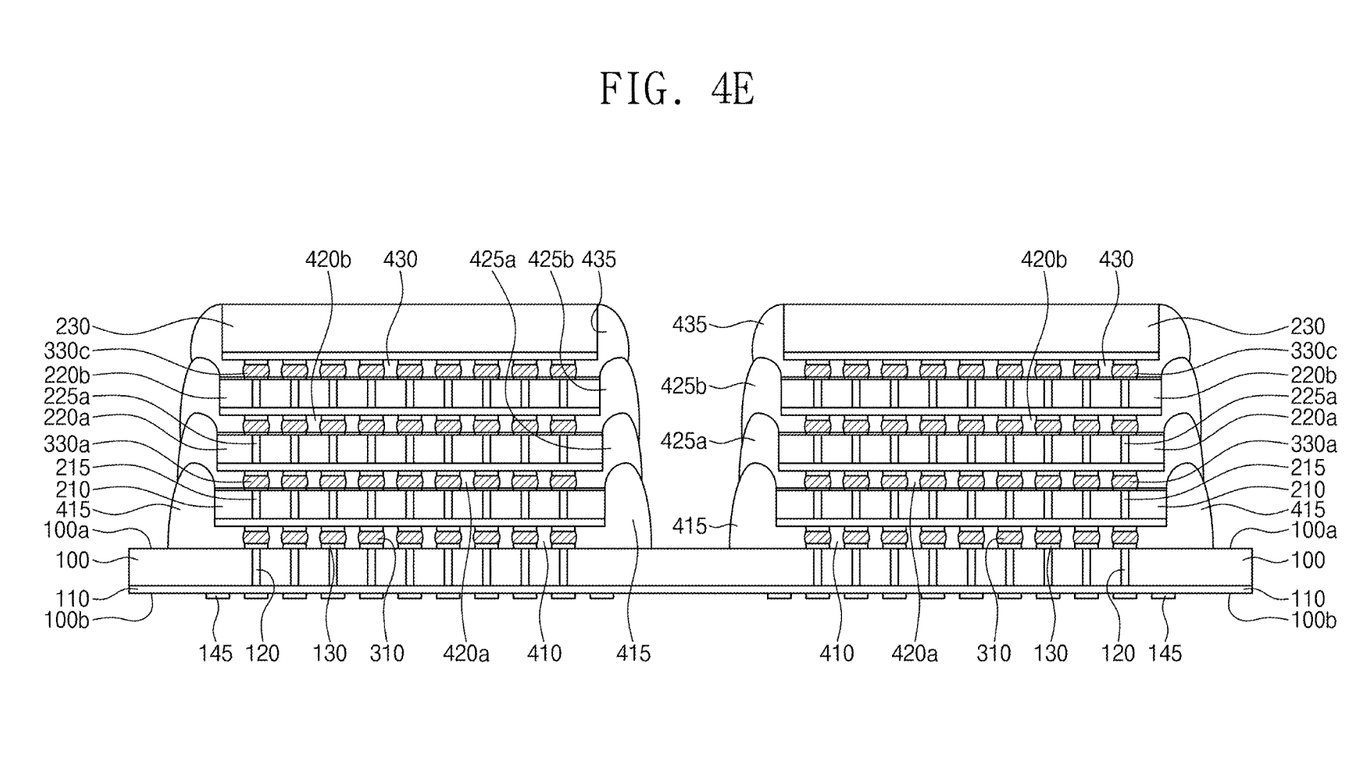

Referring to FIG. 4E, the processes discussed in FIGS. 4A through 4D may be repetitively performed to couple a plurality of second middle semiconductor chips 220b onto the first middle semiconductor chips 220a and further couple a plurality of upper semiconductor chips 230 onto the second middle semiconductor chips 220b. A plurality of second upper connecting members 330b and a second non-conductive layer 420b surrounding the second upper connecting members 330b may be formed between one of the first middle semiconductor chips 220a and its adjacent one of the second middle semiconductor chips 220b. The second non-conductive layers 420b may have portions protruding outward from side surfaces of the second middle semiconductor chips 220b and further protruding in the vertical direction from the top surface 100a of the substrate 100. Protruding portions of the second middle non-conductive layers 420b may be formed or referred to as second middle extensions 425b. A plurality of third upper connecting members 330c and an upper non-conductive layer 430 surrounding the third upper connecting members 330c may be formed between one of the second middle semiconductor chips 220b and its adjacent one of the upper semiconductor chips 230. The upper non-conductive layers 430 may have portions protruding outward from side surfaces of the upper semiconductor chips 230 and further protruding in the vertical direction from the top surface 100a of the substrate 100. Protruding portions of the upper non-conductive layers 430 may be formed or referred to as upper extensions 435. The first and second middle extensions 425a and 425b may not be in contact with the second middle semiconductor chips 220b and the upper semiconductor chips 230, respectively.

Figure 4F:
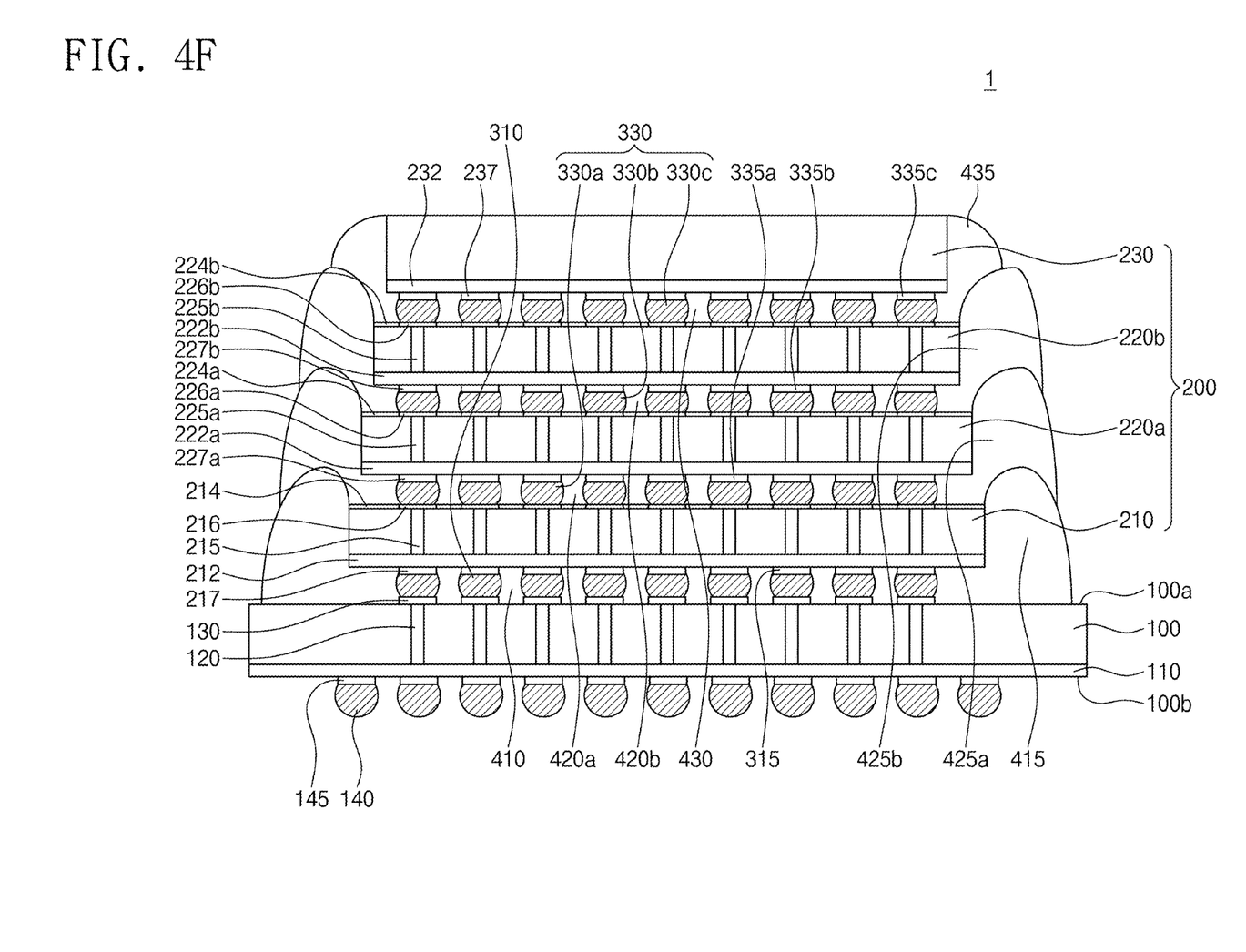

Referring to FIG. 4F, a plurality of outer terminals 140 may be formed on the bottom surface 100b of the substrate 100, and thereafter a process such as a cutting process (e.g., sawing process) may be performed to fabricate a semiconductor package 1. Outer terminals 140 may be formed on the outer terminal pads 145 disposed on the bottom surface 100b of the substrate 100. The lower extension 415, the first middle extension 425a, the second middle extension 425b, and the upper extension 435 that are formed by the thermo-compression bonding process may surround the side surfaces of the lower semiconductor chip 210, the first middle semiconductor chip 220a, the second middle semiconductor chip 220b, and the upper semiconductor chip 230, respectively.

Figure 5:
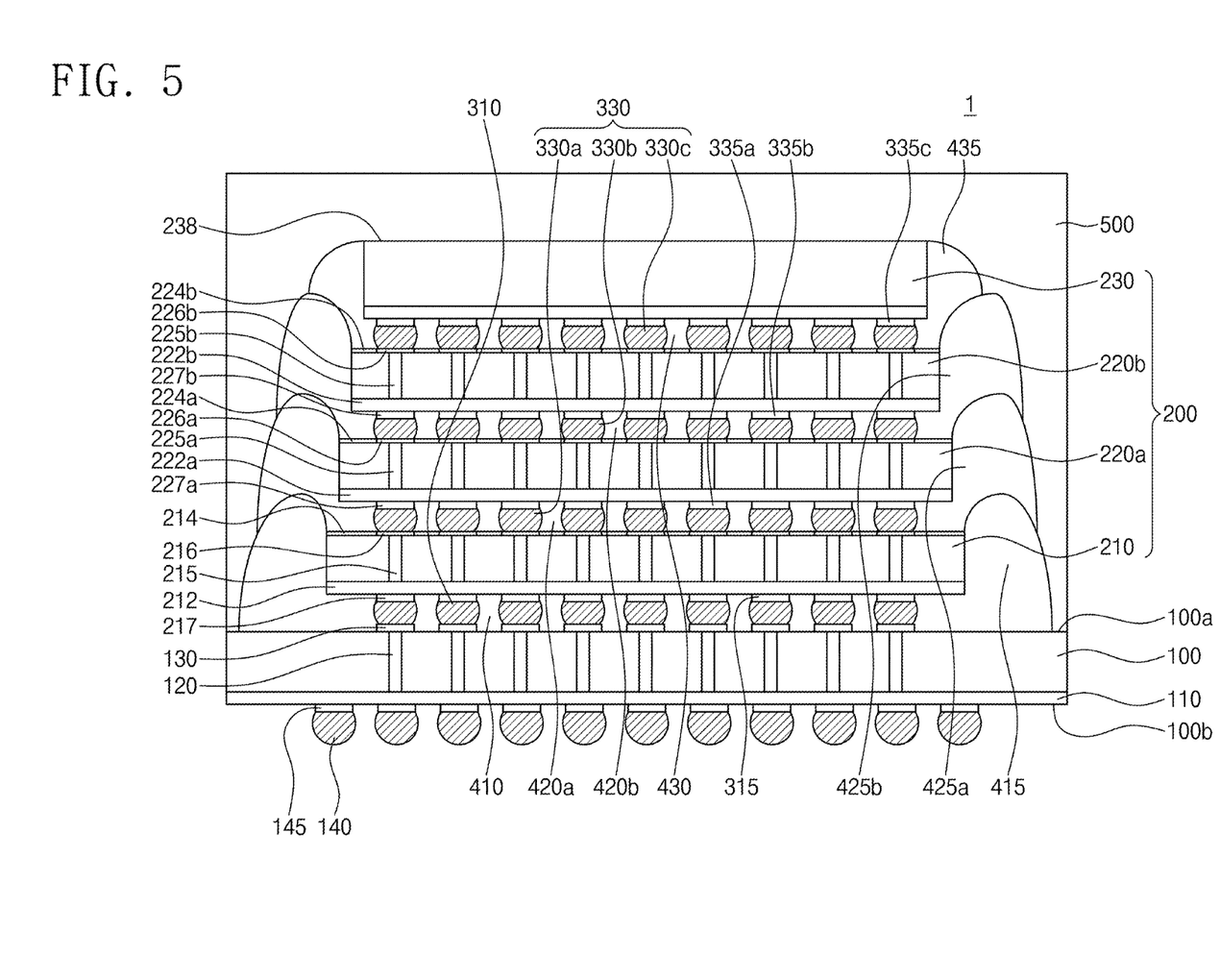
FIG. 5 is a cross-sectional view illustrating a semiconductor package according to an example embodiment of inventive concepts.

FIG. 5 is a cross-sectional view illustrating a semiconductor package according to an example embodiment of inventive concepts. In the description that follows, repeated descriptions thereof may be omitted for the sake of brevity.

Referring to FIG. 5, a mold layer 500 may be provided to encapsulate the lower semiconductor chip 210, the middle semiconductor chips 220a and 220b, and the upper semiconductor chip 230, and cover a top surface 238 of the upper semiconductor chip 230. The mold layer 500 may include an insulative polymer material such as an epoxy molding compound (EMC). The lower semiconductor chip 210 and the middle semiconductor chips 220a and 220b each may have a first thickness t1, and the upper semiconductor chip 230 may have a second thickness t2. The second thickness t2 may be greater than the first thickness t1. If the upper extension 435 may flow onto the top surface 238 of the upper semiconductor chip 230, the upper extension 435 may be in contact with a mold tool in a subsequent process for forming the mold layer 500 and thus defects may occur in the upper semiconductor chip 230. To reduce the occurrence of defects, the thermo-compression boding process may be performed using the upper semiconductor chip 230 having a relatively greater thickness. Therefore, the upper extension 435 may have an uppermost end that is flush with or lower than the top surface 238 of the upper semiconductor chip 230.

Alternatively, the mold layer 500 may not cover the top surface 238 of the upper semiconductor chip 230.

According to some example embodiments described above, semiconductor chips may be provided to have smaller widths with increasing distance from the substrate and may not be in contact with the extensions, which may reduce and/or prevent crack formation at edges of the semiconductor chips and poor interconnections between the semiconductor chips and the connecting members.

Furthermore, the upper semiconductor chip may have the thickness greater than those of other semiconductor chips such that the upper extension may have the uppermost end lower than the top surface of the upper semiconductor chip. Thus, the upper extension may be reduced and/or prevented from contacting with the bonding tool and the upper semiconductor chip may be free of cracks.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor package comprising:
   a substrate including a plurality of vias;
   a chip stack on the substrate, the chip stack including a lower semiconductor chip on the substrate, an upper semiconductor chip on the lower semiconductor chip, and a middle semiconductor chip between the lower semiconductor chip and the upper semiconductor chip;

a lower non-conductive layer between the substrate and the lower semiconductor chip;

a middle non-conductive layer between the lower semiconductor chip and the middle semiconductor chip; and an upper non-conductive layer between the middle semiconductor chip and the upper semiconductor chip, a width of the middle semiconductor chip being greater than a width of the upper semiconductor chip and less than a width of the lower semiconductor chip, wherein the middle non-conductive layer includes a middle extension protruding outside of the middle semiconductor chip and covering side surfaces of the middle semiconductor chip, and the middle extension has an uppermost end higher than a bottom surface of the upper semiconductor chip, a width of the middle non-conductive layer is less than a width of the lower non-conductive layer, and a width of the upper non-conductive layer is less than the width of the middle non-conductive layer, the middle extension is spaced apart from the upper semiconductor chip, in plan view.

2. The semiconductor package of claim 1, wherein the middle semiconductor chip includes a plurality of middle semiconductor chips, and the plurality of the middle semiconductor chips have smaller widths as a distance from a top surface of the substrate increases.

3. The semiconductor package of claim 1, wherein the lower non-conductive layer includes a lower extension protruding outside of the lower semiconductor chip and covering side surfaces of the lower semiconductor chip, the upper non-conductive layer includes an upper extension protruding outside of the upper semiconductor chip and covering side surfaces of the upper semiconductor chip, the lower extension is spaced apart from the side surfaces of the middle semiconductor chip, and the middle extension is spaced apart from the side surfaces of the upper semiconductor chip.

4. The semiconductor package of claim 3, wherein the lower extension has an uppermost end higher than a bottom surface of the middle semiconductor chip.

5. The semiconductor package of claim 3, wherein the upper extension has an uppermost end flush with or lower than a top surface of the upper semiconductor chip.

6. A semiconductor package comprising:

a plurality of non-conductive layers stacked on top of each other, each of the non-conductive layers including extension portions at respective sides that protrude upward compared to a region between the extension portions, the non-conductive layers including an intermediate non-conductive layer between an upper non-conductive layer and a lower non-conductive layer, a width of the intermediate non-conductive layer being less than a width of the lower non-conductive layer and greater than a width of the upper non- conductive layer;

a lower semiconductor chip between the lower non-conductive layer and the intermediate non-conductive layer such that lower semiconductor chip is on the region between the extension portions of the lower non-conductive layer;

an intermediate semiconductor chip between the intermediate non-conductive layer and the upper non-conductive layer such that intermediate semiconductor chip is on the region between the extension portions of the intermediate non-conductive layer; and an upper semiconductor chip on the region between the extension portions of the upper non-conductive layer, a bottom surface of the upper semiconductor chip being below an uppermost end of the extension portions of the intermediate non-conductive layer, wherein a width of the intermediate non-conductive layer is less than a width of the lower non-conductive layer, and a width of the upper non-conductive layer is less than the width of the intermediate non-conductive layer, the extension portions of the intermediate non-conductive layer is spaced apart from the upper semiconductor chip, in plan view.

7. The semiconductor package of claim 6, wherein a width of the intermediate semiconductor chip is less than a width of the lower semiconductor chip and greater than a width of the upper semiconductor chip.

8. The semiconductor package of claim 6, wherein the lower semiconductor chip, the intermediate semiconductor chip, and the upper semiconductor chips each include a memory chip.

9. The semiconductor package of claim 6, wherein a thickness of the intermediate semiconductor chip is less than a thickness of the upper semiconductor chip.

10. The semiconductor package of claim 6, wherein the extension portions of the intermediate non-conductive layer are between the extension portions of the lower non-conductive layer and the extension portions of the upper non-conductive layer.

* * * * *